US012712163B2

(12) United States Patent
Lee et al.

(10) Patent No.: US 12,712,163 B2
(45) Date of Patent: Aug. 18, 2026

(54) SUBSTRATE TREATING APPARATUS AND SUBSTRATE TREATING METHOD

(71) Applicant: SEMES CO., LTD., Chungcheongnam-do (KR)

(72) Inventors: Chung Woo Lee, Gyeonggi-do (KR); Chang Jun Park, Gyeonggi-do (KR); Tae Dong Park, Gyeonggi-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 434 days.

(21) Appl. No.: 17/890,395

(22) Filed: Aug. 18, 2022

(65) Prior Publication Data

US 2023/0067873 A1 Mar. 2, 2023

(51) Int. Cl.

| | |
|---|---|
| ***B25J 9/16*** | (2006.01) |
| ***B25J 11/00*** | (2006.01) |
| ***B25J 13/08*** | (2006.01) |
| ***G06T 7/60*** | (2017.01) |
| ***G06T 7/73*** | (2017.01) |
| ***H01J 37/32*** | (2006.01) |

(Continued)

(52) U.S. Cl.

CPC ....... *H01J 37/32743* (2013.01); *B25J 9/1697* (2013.01); *B25J 11/0095* (2013.01); *B25J 13/08* (2013.01); *G06T 7/60* (2013.01); *G06T 7/73* (2017.01); *H10P 72/0606* (2026.01); *H10P 72/53* (2026.01); *H10P 72/7602* (2026.01); *G06T 2207/30148* (2013.01); *H01J 2237/20278* (2013.01); *H01J 2237/24578* (2013.01); *H01J 2237/334* (2013.01)

(58) Field of Classification Search

None

See application file for complete search history.

(56) References Cited

U.S. PATENT DOCUMENTS

| | | | | |
|---|---|---|---|---|
| 6,075,334 A * | 6/2000 | Sagues | .............. H01L 21/67766 | 414/416.03 |
| 2003/0014157 A1* | 1/2003 | Freeman | ............. H10P 72/0606 | 700/218 |

(Continued)

FOREIGN PATENT DOCUMENTS

| | | |
|---|---|---|
| JP | 2019-048350 A | 3/2019 |
| JP | 2021-048270 A | 3/2021 |

(Continued)

OTHER PUBLICATIONS

Korean Office Action issued in corresponding KR Patent Application No. 10-2021-0112152, dated Apr. 20, 2023, with English translation.

(Continued)

*Primary Examiner* — Karla A Moore

(74) *Attorney, Agent, or Firm* — Carter, DeLuca & Farrell LLP

(57) ABSTRACT

The inventive concept provides a substrate treating apparatus. The substrate treating apparatus includes a chamber having an entrance for taking in and taking out a substrate at a side wall; a support unit provided inside of the chamber and supporting the substrate; an imaging unit for imaging a substrate being taken in by a transfer robot through the entrance; and a controller is configured to control a position of the transfer robot based on an image data from the imaging unit.

12 Claims, 9 Drawing Sheets

(51) Int. Cl.
*H10P 72/00* (2026.01)
*H10P 72/50* (2026.01)
*H10P 72/76* (2026.01)

(56) References Cited

U.S. PATENT DOCUMENTS

2004/0253091 A1* 12/2004 Iida .................... H01L 21/6715 414/217
2005/0103275 A1* 5/2005 Sasaki ............... H01J 37/32706 118/728
2006/0137988 A1* 6/2006 Yahashi ................ H01L 21/681 205/82
2007/0189596 A1* 8/2007 Lee .......................... G06T 7/33 382/151
2008/0101912 A1* 5/2008 Martin .................... H10P 72/53 414/935
2010/0280790 A1* 11/2010 Rodnick ................. H10P 72/53 356/621
2013/0053997 A1* 2/2013 Ohashi .................... H10P 72/50 901/3
2021/0257242 A1 8/2021 Yoshida
2024/0021458 A1* 1/2024 Bergantz ................. H10P 72/53

FOREIGN PATENT DOCUMENTS

KR 10-2005-0005031 A 1/2005
KR 10-2008-0084310 A 9/2008
KR 20050005031 * 9/2008
KR 10-2018-0033447 A 4/2018
KR 10-2175088 B1 11/2020

OTHER PUBLICATIONS

Chinese Office Action issued by the China National Intellectual Property Administration on Jan. 20, 2026 in corresponding CN Patent Application No. 202211023933.3, with English translation.

* cited by examiner 1000
1400
1410
1420
1421
1430
1320
1322
1312
1310
1300
1380
1102
1200
W
1220
1211
1210
1250
1500
1126
1213
1223
1240
1122
1230
1151
1104
100
1124
1120
1110
1100

2000
242
246
246a
246b
246c
246d
244
2800
2500
2400
2500
A2
1126
W
1200
1100
1110
1120
2200
2500
2500

SUBSTRATE TREATING APPARATUS AND SUBSTRATE TREATING METHOD

CROSS-REFERENCE TO RELATED APPLICATIONS

A claim for priority under 35 U.S.C. § 119 is made to Korean Patent Application No. 10-2021-0112152 filed on Aug. 25, 2021, in the Korean Intellectual Property Office, the entire contents of which are hereby incorporated by reference.

BACKGROUND

Embodiments of the inventive concept described herein relate to a substrate treating apparatus and a substrate treating method.

A plasma refers to an ionized gas state composed of ions, radicals, electrons or the like. The plasma is generated by a very high temperature, a strong electric field, or an RF electromagnetic field. A semiconductor device manufacturing process may include an etching process of removing a thin film formed on a substrate such as a wafer using the plasma. The etching process is performed by colliding ions and/or radicals of the plasma with or reacting with the thin film on the substrate.

A substrate treating apparatus using the plasma includes a process chamber and a support chuck (e.g., ESC) supporting the substrate in the process chamber where an entrance through which the substrate is carried in and out is formed on one side wall of the process chamber. The substrate is seated on the support chuck after passing through the entrance of the process chamber by a transfer robot. In this case, there is need to teach the position of the transfer robot, e.g., the traveling path of the transfer robot so as to pass through the entrance without collide with the sidewall and place the substrate onto the right position of the support chuck.

In general, the teaching operation is performed directly by an operator. The operator adjusts the position of the transfer robot by directly adjusting the transfer robot control device such as a controller while a chamber is opened. In this case, since a large amount of work time is required, a total process time is increased, and the work time varies depending on the operators having different levels of skill. In addition, since the position of the transfer robot or the position of a transferred substrate varies according to the skill level of the operator, there is a problem that a mounting position of the substrate is not constant.

SUMMARY

Embodiments of the inventive concept provide a substrate treating apparatus and substrate treating method for adjusting a position of a transfer robot automatically during a teaching operation of the transfer robot.

Embodiments of the inventive concept provide a substrate treating apparatus and a substrate treating method for controlling a position of a transfer robot to a certain standard regardless of a skill level of an operator.

The technical objectives of the inventive concept are not limited to the above-mentioned ones, and the other unmentioned technical objects will become apparent to those skilled in the art from the following description.

The inventive concept provides a substrate treating apparatus. The substrate treating apparatus includes a chamber having an entrance for taking in and taking out a substrate formed at one side wall; a substrate support unit provided inside of the chamber and supporting the substrate; an imaging unit for imaging a substrate taken in and taken out by a transfer robot through the entrance; and a controller is configured to control a position of the transfer robot by receiving an image data from the imaging unit.

In an embodiment, the controller includes: a first controller receiving the image data from the imaging unit and calculating a position data of the transfer robot; and a second controller receiving a position data of the transfer robot from the first controller to control the transfer robot.

In an embodiment, the imaging unit is installed outside of the chamber.

In an embodiment, the imaging unit is installed at a position facing the entrance and includes a first camera module for imaging the entrance.

In an embodiment, the imaging unit includes a second camera module installed above the chamber for imaging a support unit.

In an embodiment, the first camera module generates a first image data by imaging a process of the substrate passing through the entrance from before the substrate enters the entrance, and the first controller receives the first image data in real time from the first camera module to generate a first position data of the transfer robot so the substrate passes through the entrance.

In an embodiment, the entrance includes a first apex to a fourth apex adjacent to each other when viewed from a side, the substrate includes a first end point, and a second endpoint positioned opposite to the first end point when viewed from a side, the first controller identifies the first apex to the fourth apex of the entrance and the first end point and the second end point of the substrate from the first image data, the first controller generates the first position data of the transfer robot so the first end point and the second end point of the substrate are positioned within the first apex to the fourth apex of the entrance, and the second controller controls the position of the transfer robot by receiving the first position data from the first controller in real time.

In an embodiment, the second camera module generates a second image data by imaging a process of a substrate which has entered into the chamber through the entrance being transferred to a top part of the support unit, and the first controller generates a second position data of the transfer robot by receiving the second image data from the second camera module in real time.

In an embodiment, the first controller identifies a center point of the support unit and a center point of the substrate through the second image data, the first controller calculates the second position data of the transfer robot so the center point of the support unit and the center point of the substrate become substantially the same, and the second controller controls the transfer robot by receiving the position data of the transfer robot from the first controller.

In an embodiment, the first controller identifies a first apex to a fourth apex of the entrance through the first image data, the first controller calculates a first height information between the first end point and a line segment connecting the first apex and a second apex and a second height information between the second end point and the line segment, and the first controller generates the first position data by determining whether the first height information and the second height information correspond to a target value.

In an embodiment, the first controller identifies a first apex to a fourth apex of the entrance and a first end point and a second end point of the substrate through the first image data, the first controller calculates a first width information between the first end point and a line segment connecting the first apex to the fourth apex and a second width information between the second end point and a line segment connecting the second apex and the third apex, and the first controller generates the first position data by determining whether the first width information and the second width information correspond to a target value.

In an embodiment, the first camera module and the second camera module each include an auxiliary member, and the auxiliary member includes at least one of a distance measuring member, an illuminating member, and a laser, and an inference pattern forming member.

The inventive concept provides a substrate treating method. The substrate treating method includes treating a substrate transferred to a support unit provided inside of a chamber through an entrance formed at one sidewall, and wherein the substrate is transferred by a transfer robot, and a position of the transfer robot is controlled by a position data calculated from an image data which has imaged a substrate taken in through the entrance.

In an embodiment, the image data includes a first image data generated from a first camera module installed outside the chamber and imaging the entrance of the chamber, the position data is calculated from the first image data, and includes a first position data to move a first end point and a second end point of the substrate within a first apex to a fourth apex of the entrance, and the position of the transfer robot is controlled by the first position data.

In an embodiment, the position data includes a first height information and a second width information between the first end point and the entrance, and a second height information and a second width information between the second end point and the entrance.

In an embodiment, the image data includes a second image data generated from a second camera module installed outside of the chamber and imaging a support unit, the position data includes a second position data calculated from the second image data which moves the transfer robot so a center point of the support unit and a center point of the substrate become substantially the same, and a position of the transfer robot is controlled by the second position data.

In an embodiment, the position of the transfer robot is controlled firstly according to the first position data and then secondly according to the second position data.

The inventive concept provides a teaching method for a transfer robot having a transfer hand on which a substrate is placed thereon. The teaching method for the transfer robot includes teaching a position at which the transfer hand enters an entrance using a first image data acquired from imaging an entrance of the chamber which is a first teaching step; and teaching a position at which the transfer hand is positioned at a top part of a support unit using a second image data acquired from imaging the support unit provided within the chamber which is a second teaching step, and wherein the second teaching step is performed after the first teaching step.

In an embodiment, at the first teaching step, a position of the transfer hand is taught so that each end points of the substrate are positioned within four apexes of the entrance.

In an embodiment, at the second teaching step, the position of the transfer hand is taught so that a center point of the substrate becomes substantially the same as a center point of the support unit.

According to an embodiment of the inventive concept, a substrate treating apparatus and a substrate treating method for adjusting a position of a transfer robot automatically during a teaching operation of the transfer robot may be provided.

According to an embodiment of the inventive concept, a substrate treating apparatus and a substrate treating method for controlling a position of a transfer robot to a certain standard regardless of a skill level of an operator may be provided.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
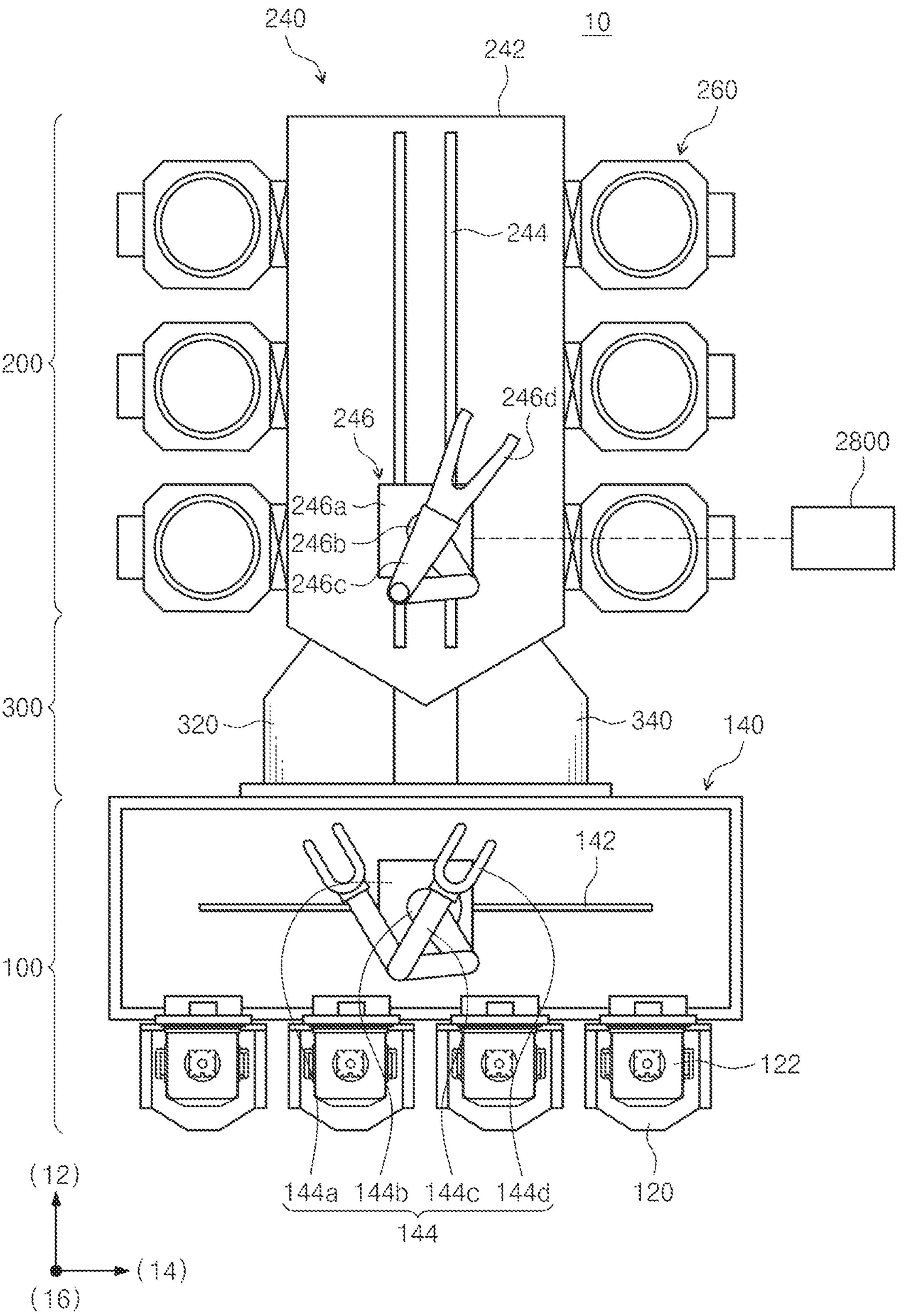
FIG. 1 is a plan view illustrating a substrate treating facility according to an embodiment of the inventive concept.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms “a”, “an” and “the” are intended to include the plural forms as well, unless the context clearly indicates otherwise. It will be further understood that the terms “comprises”, “comprising,”, “includes”, and/or “including” when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "example" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

It should be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Other terms such as "between", "adjacent", "near" or the like should be interpreted in the same way.

Unless otherwise defined, all terms used herein, including technical or scientific terms, have the same meaning as those generally understood by those skilled in the art to which the inventive concept belongs. Terms such as those defined in commonly used dictionaries should be interpreted as consistent with the context of the relevant technology and not as ideal or excessively formal unless clearly defined in this application.

Hereinafter, an embodiment of the inventive concept will be described with reference to the drawings.

FIG. 1 is a plan view illustrating a substrate treating facility according to an embodiment of the inventive concept.

Referring to FIG. 1, the substrate treating facility 10 may include an index module 100, a process module 200, and a load lock module 300.

The index module 100 may include a load port 120 and a transfer frame 140. The load port 120, the transfer frame 140, the load lock module 300, and the process module 200 may be sequentially arranged in a direction.

Hereinafter, a direction in which the load port 120, the transfer frame 140, the load lock module 300, and the process module 200 are arranged is referred to as a first direction 12, a direction perpendicular to the first direction 12 when viewed from the top is referred to as a second direction 14, and a direction perpendicular to a plane including the first direction 12 and the second direction 14 is referred to as a third direction 16.

A cassette 122 in which a plurality of substrates W are stored may be seated on the load port 120. A plurality of load ports 120 may be provided, and they may be arranged in a direction along the second direction 14. FIG. 1 shows that four load ports 120 are provided. However, the number of load ports 120 may increase or decrease according to conditions such as a process efficiency and a foot print of the process module 200.

A slot (not shown) provided to support an edge of a substrate may be formed at the cassette 122. A plurality of slots are provided in the third direction 16, and the substrate is positioned in the cassette 122 to be stacked in a state spaced apart from each other along the third direction 16. For the cassette 122, a front opening integrated pod (FOUP) may be used.

The transfer frame 140 transfers the substrate W between the cassette 122 mounted on the load port 120 and the load lock module 300. The transfer frame 140 is provided with an index rail 142 and an index robot 144. The index rail 142 is provided in a lengthwise direction parallel to the second direction 14. The index robot 144 is installed on the index rail 142 and is linearly moved in the second direction 14 along the index rail 142. The index robot 144 has a base **144*a*, a body 144*b*, an index arm 144*c*, and a hand 144*d***.

The base **144*a* is installed to be movable along the index rail 142. The body 144*b* is coupled to the base 144*a*. The body 144*b* is provided to be movable along the third direction 16 on the base 144*a*. In addition, the body 144*b* is provided to be rotatable on the base 144*a*. The index arm 144*c* is coupled to the body 144*b* and is provided to be forwardly and backwardly movable with respect to the body 144*b*. A plurality of index arms 144*c* are provided to be individually driven. The index arms 144*c* are disposed to be stacked in a state spaced apart from each other along the third direction 16. Some of the index arms 144*c* may be used to transfer the substrate W from the process module 200 to the cassette 122, and others may be used to transfer the substrate W from the cassette 122 to the process module 200. In this case, particles generated from the substrate W before a process treatment may be prevented from being attached to the substrate W after the process treatment during a process of carrying in and out the substrate W by the index robot 144**.

The load lock module 300 is disposed between the transfer frame 140 and the transfer unit 240. The load lock module 300 replaces an atmospheric pressure atmosphere of the index module 100 with a vacuum atmosphere of the process module 200 with respect to the substrate W carried into the process module 200, or replaces the vacuum atmosphere of the process module 200 with the atmospheric pressure atmosphere of the index module 100. The load lock module 300 provides a space in which the substrate W remains before the substrate W is transferred between the transfer unit 240 and the transfer frame 140. The load lock module 300 includes a load lock chamber 320 and an unload lock chamber 340.

In the load lock chamber 320, the substrate W transferred from the index module 100 to the process module 200 temporarily remains. The load lock chamber 320 maintains an atmospheric pressure atmosphere in an atmospheric state, is blocked with respect to the process module 200, and remains open with respect to the index module 100. When the substrate W is introduced into the load lock chamber 320, an inner space is sealed with respect to each of the index module 100 and the process module 200. Thereafter, the inner space of the load lock chamber 320 is replaced with a vacuum atmosphere in an atmospheric pressure atmosphere, and is opened to the process module 200 while being blocked for the index module 100.

In the unload lock chamber 340, the substrate W transferred from the process module 200 to the index module 100 temporarily remains. The unload lock chamber 340 maintains the vacuum atmosphere in an atmospheric state, is blocked with respect to the index module 100, while maintaining an open state with respect to the process module 200. When the substrate W is introduced into the unload lock chamber 340, the inner space is sealed with respect to each of the index module 100 and the process module 200. Thereafter, the inner space of the unloaded lock chamber

340 is replaced with the atmospheric pressure atmosphere from a vacuum atmosphere, and is opened to the index module 100 while being blocked with respect to the process module 200.

The process module 200 includes a transfer unit 240 and a plurality of process chambers 260.

The transfer unit 240 transfers the substrate W between the load lock chamber 320, the unload lock chamber 340, and the plurality of process chambers 260. The transfer unit 240 includes a transfer chamber 242 and a substrate transfer device.

The transfer chamber 242 may be provided in a rectangular shape. Selectively, the transfer chamber 242 may be provided in various shapes. The plurality of process chambers 260 may be positioned on both side of the transfer chamber 242. The transfer chamber 242 has a transfer space for transferring the substrate W. The transfer space may be provided as a vacuum environment.

A transfer rail 244 and a transfer robot 246 may be provided in the transfer chamber 242. The transfer rail 244 is provided in a lengthwise direction parallel to the first direction 12. The transfer robot 246 is installed on the transfer rail 244, and is linearly moved in the first direction 12 along the transfer rail 244. The transfer robot 246 may transfer the substrate W between the load lock module 300 and the process chamber 260. As will be described later, the transfer robot 246 may carry the substrate W into the treating space 1102 of the chamber 1100 through an entrance 1126 of the chamber 1100*r*. The transfer robot 246 may take out the substrate W from the treating space 1102 through the entrance 1126.

The transfer robot 246 has a base 246*a*, a body 246*b*, a transfer arm 246*c*, and a transfer hand 246*d*. The base 246*a* is installed to be movable along the transfer rail 244. The body 246*b* is coupled to the base 246*a*. The body 246*b* is provided to be movable along the third direction 16 on the base 246*a*. In addition, the body 246*b* is provided to be rotatable on the base 246*a*. The transfer arm 246*c* is coupled to the body 246*b* and is provided to be forwardly and backwardly movable with respect to the body 246*b*.

At least one process chamber 260 may be connected to the transfer chamber 242. The process chamber 260 may be a chamber that performs a process on the substrate W. The process chamber 260 may be a liquid treatment chamber that treats the substrate W by supplying a treating liquid to the substrate W. In addition, the process chamber 260 may be a plasma chamber that treats the substrate W using a plasma. Furthermore, some of the process chambers 2600 may be liquid treatment chambers that treat the substrate W by supplying the treating liquid to the substrate W, and some other process chambers 260 may be plasma chambers that treat the substrate W using the plasma. However, this invention is not limited to it, and the substrate W treatment process performed by the process chamber 260 can be variously modified by a known substrate W treatment process. In addition, when the process chamber 260 is a plasma chamber that treats the substrate W using the plasma, the plasma chamber may be a chamber that performs an etching or ashing process of removing a thin film on the substrate W using the plasma. However, this invention is not limited to it, and a plasma treatment process performed by the process chamber 260 can be variously modified by a known plasma treatment process.

Figure 2:
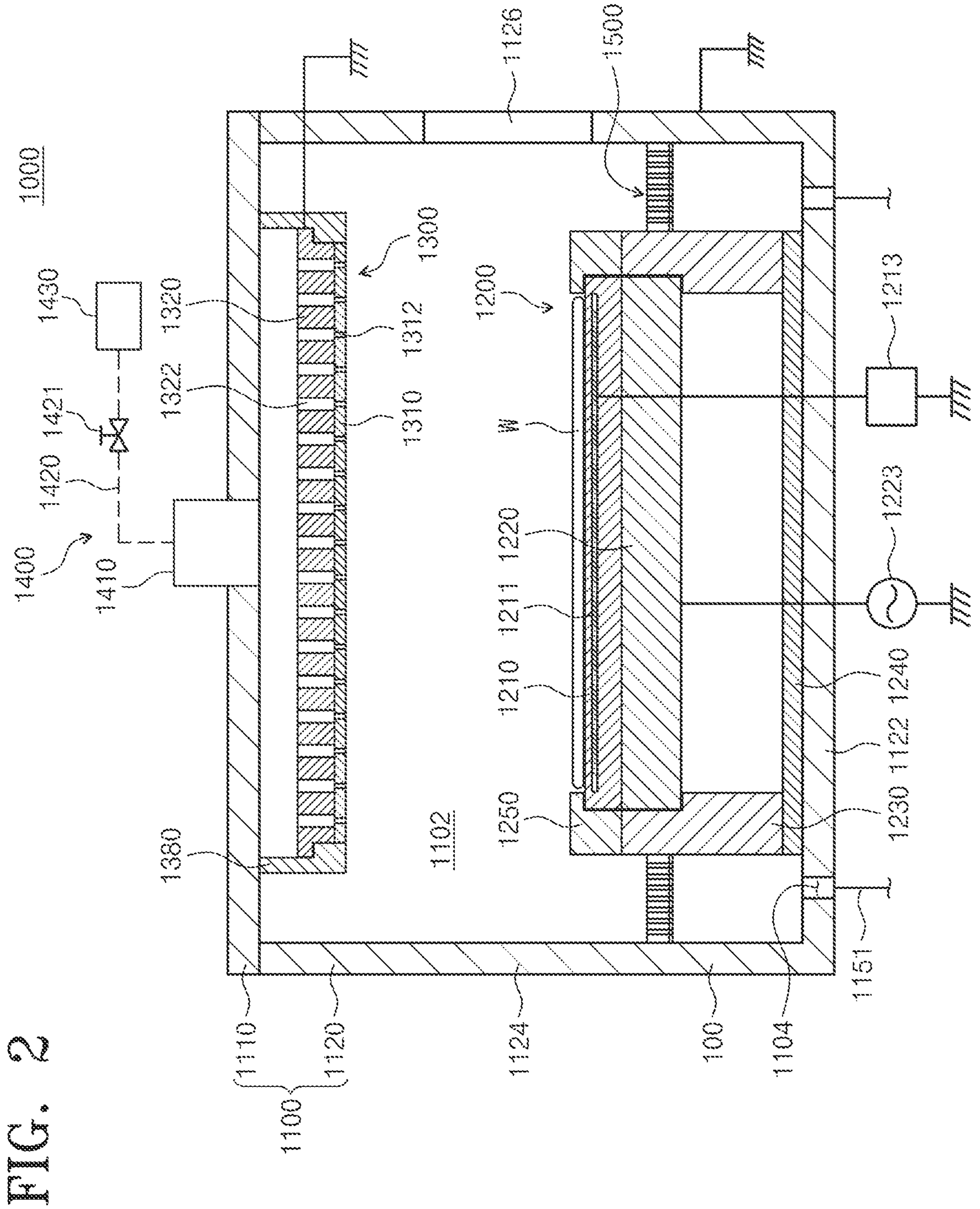
FIG. 2 illustrates a state of a substrate treating apparatus provided in a process chamber of FIG. 1.

FIG. 2 illustrates a state of a substrate treating apparatus provided in the process chamber of FIG. 1. Hereinafter, the substrate treating apparatus 1000 provided to the process chamber 260 will be described in detail with reference to FIG. 2. The substrate treating apparatus 1000 may treat the substrate W by transferring a plasma to the substrate W.

The substrate treating apparatus 1000 treats the substrate W using the plasma. The substrate treating apparatus 1000 includes a chamber 1100, a support unit 1200, a shower head unit 1300, a gas supply unit 1400, a plasma source, and a baffle unit 1500.

The chamber 1100 has a treating space 1102 in which a substrate treatment process is performed. The chamber 1100 may include a top housing 1110 and a bottom housing 1120. The top housing 1110 and the bottom housing 1120 may be coupled to each other to be sealed. The bottom housing 1120 may include a bottom wall 1122 facing the top housing 1110 and a plurality of sidewalls 1124 upwardly extending from an outer edge of the bottom wall 1122 and coupled to the top housing 1110. An entrance 1126 is formed on any one of the plurality of sidewalls 1124. The substrate W may be introduced into the treating space 1102 of the chamber 1100 through the entrance 1126. The substrate W may be taken out from the treating space 1102 of the chamber 1100 through the entrance 1126. The chamber 1100 may be made of a conductive material. For example, the chamber 1100 may be made of a material including a metal. The chamber 1100 may be made of an aluminum material. The chamber 1100 may be grounded. An exhaust hole 1104 is formed on the bottom wall 1122 of the chamber 1100. The exhaust hole 1104 is connected to an exhaust line 1151. The exhaust line 1151 is connected to a pump (not shown). The reaction by-products generated during the process and a gas remaining in an inner space of the chamber 1100 may be discharged to an outside through the exhaust line 1151. An inside of the chamber 1100 is depressurized to a preset pressure by an exhaust process. Alternatively, a separate depressurization member (not shown) may be provided to depressurize an inside of the treating space 1102 to a preset pressure.

A heater (not shown) is provided on a wall of the chamber 1100. The heater heats the wall of the chamber 1100. The heater is electrically connected to a heating power source (not shown). The heater generates a heat by resisting a current applied from the heating power. The heat generated from the heater is transferred to the inner space. The treating space is maintained at a preset temperature by the heat generated from the heater. The heater is provided as a coil-shaped heating wire. A plurality of heaters may be provided on the wall of the chamber 1100.

The support unit 1200 is positioned inside the chamber 1100. The support unit 1200 supports the substrate W in the treating space 1102. The support unit 1200 may be provided as an electrostatic chuck for adsorbing the substrate W using an electrostatic force. The support unit 1200 includes a dielectric plate 1210, an electrode plate 1220, a bottom cover 1230, a bottom support member 1240, and a ring member 1250.

The substrate W is placed on the dielectric plate 1210. The dielectric plate 1210 has a disk shape. The dielectric plate 1210 may be made of or comprise a dielectric substrate. The dielectric plate 1210 receives an external power to apply the electrostatic force to the substrate W. The dielectric plate 1210 is provided with an electrostatic electrode 1211. The electrostatic electrode 1211 is electrically connected to an adsorption power source 1213. The adsorption power source 1213 includes a DC power source. A switch (not shown) may be installed between the electrostatic electrode 1211 and the adsorption power source 1213. The electrostatic electrode 1211 may be electrically connected to the adsorption power source 1213 by an on/off of the switch. When the switch 1212 is turned on, a DC current is applied to the electrostatic electrode 1211. The electrostatic force is applied between the electrostatic electrode 1211 and the substrate W by a current applied to the electrostatic electrode 1211. The substrate W may be adsorbed and/or fixed to the dielectric plate 1210 by the electrostatic force.

The electrode plate 1220 is provided under the dielectric plate 1210. A top surface of the electrode plate 1220 may be in contact with a bottom surface of the dielectric plate 1210. The electrode plate 1220 may have a disk shape. The electrode plate 1220 is made of a conductive material. In an embodiment, the electrode plate 1220 may be made of an aluminum material. The electrode plate 1220 may be electrically connected to a bottom power source 1223. The bottom power source 1223 may be provided as a high-frequency power source for generating a high-frequency power. The high-frequency power may be provided as an RF power source. The RF power may be provided as a high bias power RF power source. The electrode plate 1220 receives the high-frequency power from the bottom power source 1223. The electrode plate 1220 may function as a bottom electrode.

The bottom cover 1230 supports the electrode plate 1220. The bottom cover 1230 may be provided to be in contact with a side surface of the electrode plate 1220. The bottom cover 1230 may be provided to be in contact with an edge region of a bottom surface of the electrode plate 1220. For example, the bottom cover 1230 may have a cylindrical shape in which a top and a bottom are opened. In addition, the bottom cover 1230 may be stepped inside so that the electrode plate 1220 may be supported by the bottom cover 1230. The bottom cover 1230 may be made of an insulating material.

The bottom support member 1240 is disposed under the bottom cover 1230. The bottom support member 1240 is disposed under the bottom cover 1230 to support the bottom cover 1230. In addition, the bottom support member 1240 may be made of a conductive material. For example, the bottom support member 1240 may be made of a material including a metal. Also, the bottom support member 1240 may be electrically connected to the chamber 1100.

The ring member 1250 is disposed in an edge region of the support unit 1200. The ring member 1250 has a ring form. The ring member 1250 may be provided to surround an edge region of a top surface of the dielectric plate 1210. Also, the ring member 1250 may be provided to surround a side surface of the dielectric plate 1210. Also, the ring member 1250 may be disposed on a top surface of the bottom cover 1230. The ring member 1250 may be provided as a focus ring.

The shower head unit 1300 may disperse a gas supplied from above. Also, the shower head unit 1300 may uniformly supply a gas supplied by the gas supply unit 1400 to the treating space 1102. It includes a shower head 1310 and a gas injection plate 1320.

The shower head 1310 is disposed under the gas injection plate 1320. The shower head 1310 is positioned to be downwardly spaced apart from a top surface of the chamber 1100 by a preset distance. The shower head 1310 is positioned above the support unit 1200. A preset space is formed between the shower head 1310 and the top surface of the chamber 100. The shower head 1310 may have a plate shape having a constant thickness. A bottom surface of the shower head 1310 may be anodized to prevent an arc generation due to a plasma. A cross-section of the shower head 1310 may be provided to have the same shape and cross-sectional area as the support unit 1200. A plurality of gas supply holes 1312 are formed at the shower head 1310. A gas supply hole 1312 may be formed by penetrating a top surface and a bottom surface of the shower head 1310 in an up/down direction.

The shower head 1310 may be made of a material that reacts with a plasma generated from the gas supplied by the gas supply unit 1400 to generate a compound. In an embodiment, the shower head 1310 may be made of or comprise a material that reacts with an ion having the highest electronegativity among ions included in the plasma to generate a compound. For example, the shower head 1310 may be made of a material including a silicon (Si).

The gas injection plate 1320 is disposed on the shower head 1310. The gas injection plate 1320 is positioned to be spaced apart from the top surface of the chamber 1100 by a preset distance. The gas injection plate 1320 may diffuse a gas supplied from above. A gas introduction hole 1322 may be formed on the gas injection plate 1320. The gas introduction hole 1322 may be formed at a position corresponding to the above-described gas supply hole 1312. The gas introduction hole 1322 may communicate with the gas supply hole 1312. The gas supplied from above the shower head unit 1300 may be supplied to below the shower head 1310 through the gas introduction hole 1322 and the gas supply hole 1312. The gas injection plate 1320 may include a metal material. The gas injection plate 1320 may be grounded. The gas injection plate 1320 may be grounded to function as a top electrode.

An insulation ring 1380 is disposed to surround a circumference of the shower head 1310 and the gas injection plate 1320. The insulation ring 1380 may have a circular ring form as a whole. The insulation ring 1380 may be made of a non-metallic material.

The gas supply unit 1400 supplies a gas into the chamber 1100. A gas supplied by the gas supply unit 1400 may be excited to a plasma state by a plasma source. In addition, the gas supplied by the gas supply unit 1400 may be a gas containing a fluorine. For example, the gas supplied by the gas supply unit 1400 may be a carbon tetrafluoride.

The gas supply unit 1400 includes a gas supply nozzle 1410, a gas supply line 1420, and a gas storage unit 1430. The gas supply nozzle 1410 is installed at a center of the top surface of the chamber 1100. An injection hole is formed on a bottom surface of the gas supply nozzle 1410. The injection hole supplies a process gas into the chamber 1100. The gas supply line 1420 connects the gas supply nozzle 1410 to the gas storage unit 1430. The gas supply line 1420 supplies a process gas stored in the gas storage unit 1430 to the gas supply nozzle 1410. A valve 1421 is installed at the gas supply line 1420. The valve 1421 opens and closes the gas supply line 1420, and adjusts a flow rate of the process gas supplied through the gas supply line 1420.

The plasma source excites the process gas in the chamber 1100 to a plasma state. In an embodiment of the inventive concept, a capacitively coupled plasma (CCP) is used as the plasma source. The capacitively coupled plasma may include a top electrode and a bottom electrode in the chamber 1100. The top electrode and the bottom electrode may be disposed vertically in parallel with each other in the chamber 1100. One electrode among both electrodes may apply a high-frequency power, and the other electrode may be grounded. An electromagnetic field is formed in a space between both electrodes, and a process gas supplied to the space may be excited to a plasma state. A substrate W treatment process is performed using this plasma. In an embodiment, the top electrode may be provided to the shower head unit 1300 may serve as the top electrode of the plasma source and the electrode plate may server as the bottom electrode of the plasma source. A high-frequency power may be applied to the bottom electrode, and the top electrode may be grounded. Alternatively, the high-frequency power may be applied to both the top electrode and the bottom electrode. Accordingly, an electromagnetic field is generated between the top electrode and the bottom electrode. A generated electromagnetic field excites the process gas provided into the chamber 1100 to a plasma state.

A liner unit (not shown) prevents an inner wall of the chamber 1100 and the support unit 1200 from being damaged during a process. The liner unit prevents impurities generated during the process from being deposited on the inner wall and the support unit 1200. The liner unit may include an inner liner (not shown) and an outer liner (not shown).

The outer liner is provided on an inner surface of the sidewall 1124 of the chamber 1100. The outer liner has an open top and bottom. The outer liner may have a cylindrical form. The outer liner may have a radius corresponding to the inner surface of the chamber 1100. The outer liner is provided along the inner surface of the chamber 1100. The outer liner may be made of an aluminum material. The outer liner protects the inner surface of the sidewall 1124 of the chamber 1100. In a process of exciting a process gas, an arc discharge may occur in the chamber 1100. The arc discharge damages the chamber 1100. The outer liner protects the sidewall 1124 of the chamber 1100 to prevent the inner surface of the sidewall 1124 from being damaged by the arc discharge.

The inner liner (not shown) is provided to surround the support unit 1200. The inner liner may have a ring form. The inner liner is provided to surround all of the dielectric plate 1210, the electrode plate 1220, the bottom cover 1230, and the bottom support member 1240. The inner liner may be made of an aluminum material. The inner liner protects an outer surface of the support unit 1200.

The baffle unit 1500 is positioned between the inner wall 1124 of the chamber 1100 and the support unit 1200. The baffle unit 1500 may have an annular ring form. A plurality of through holes are formed at the baffle unit 1500. A gas provided in the chamber 1100 passes through the through holes of the baffle unit 1500 and is exhausted through the exhaust hole 1104. A flow of the gas may be controlled according to a form of the baffle unit 1500 and a form of the through holes.

Figure 3:
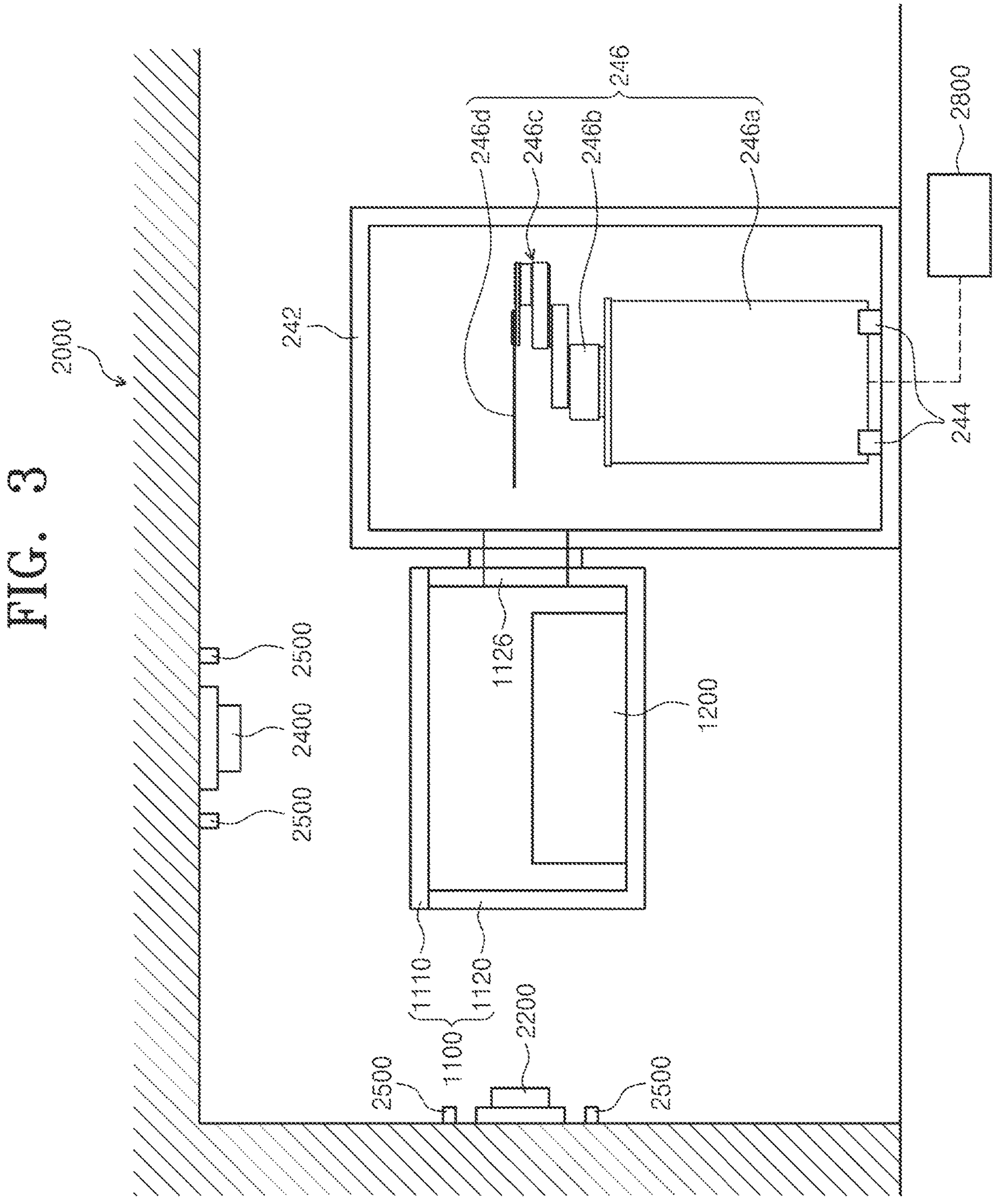
FIG. 3 schematically illustrates the substrate treating apparatus, a transfer robot, and an imaging unit of FIG. 2.
Figure 4:
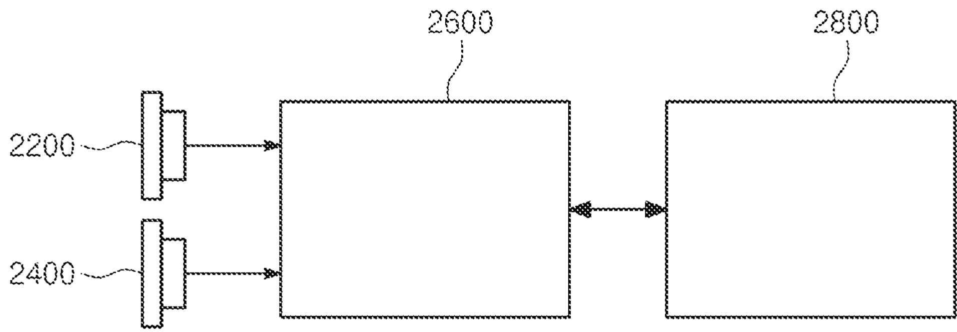
FIG. 4 schematically illustrates a controller for controlling the transfer robot of FIG. 3.
Figure 5:
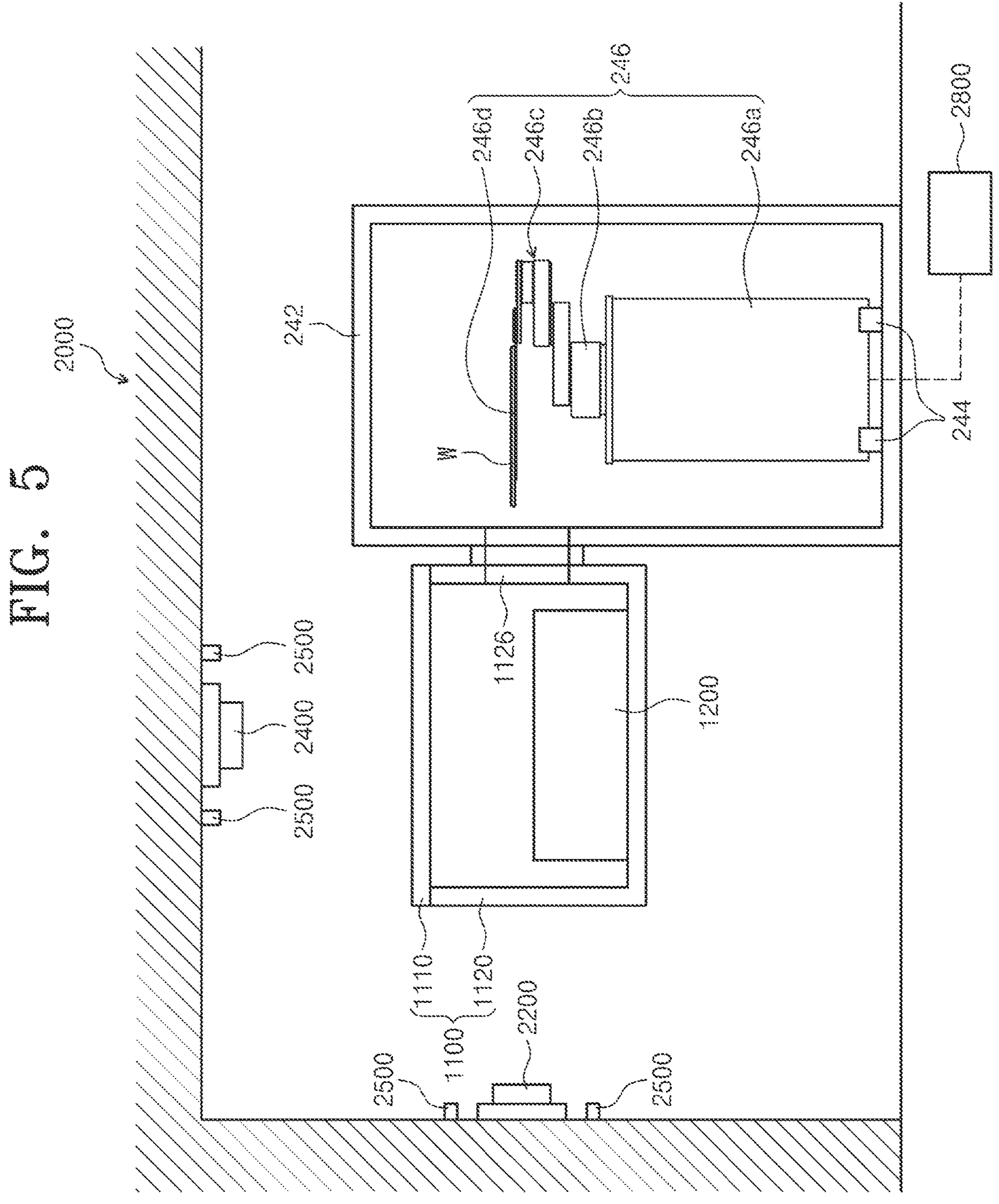
FIG. 5 and FIG. 6 are views schematically illustrating a process in which a substrate passes through an entrance by the transfer robot.
Figure 6:
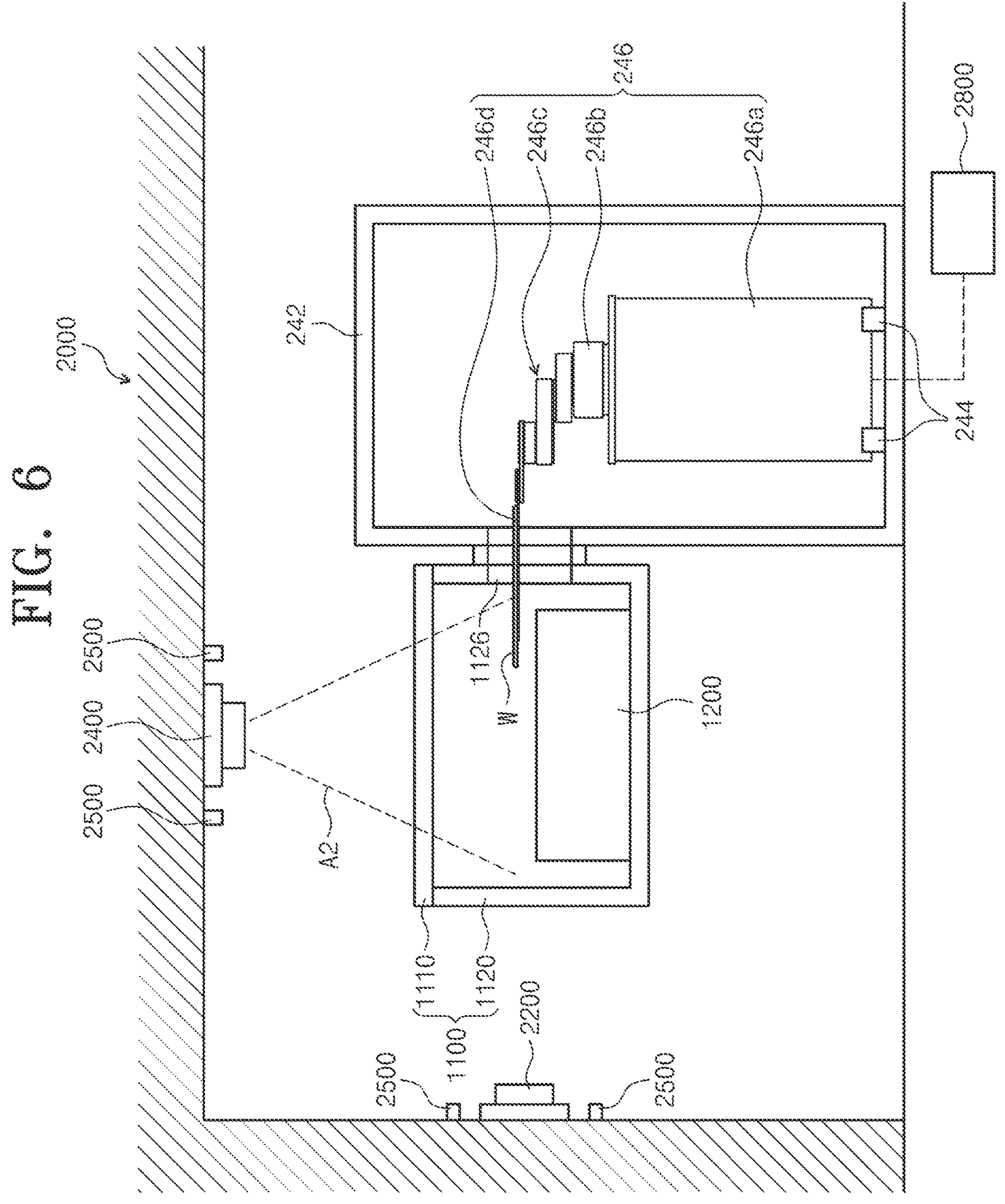
Figure 7:
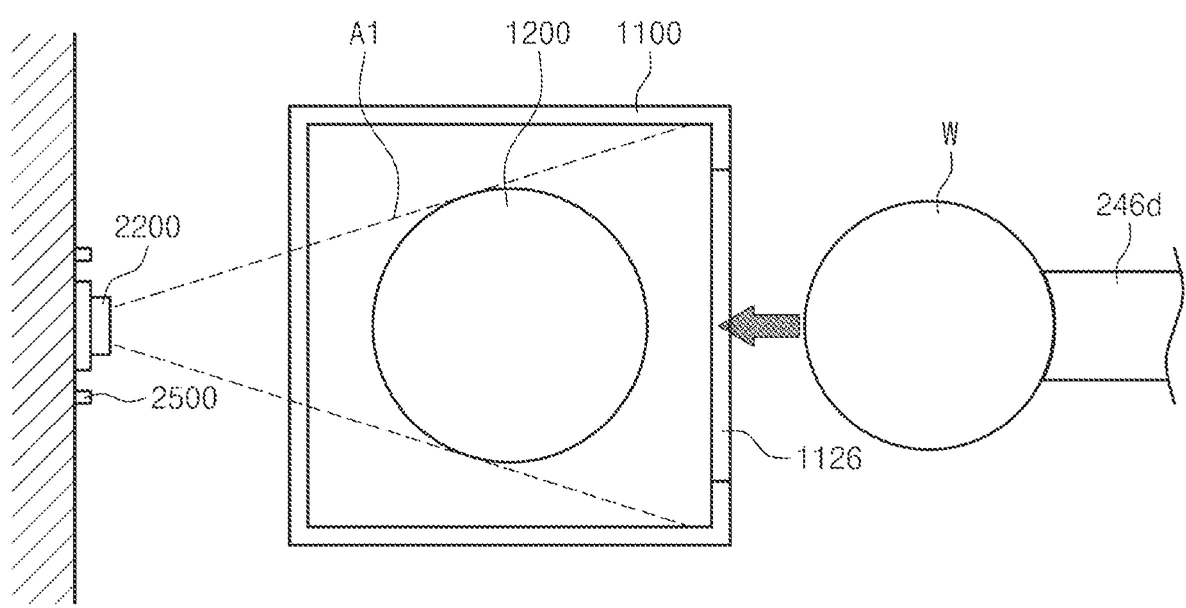
FIG. 7 and FIG. 8 are top plan views illustrating the process in which the substrate passes through the entrance by the transfer robot.
Figure 8:
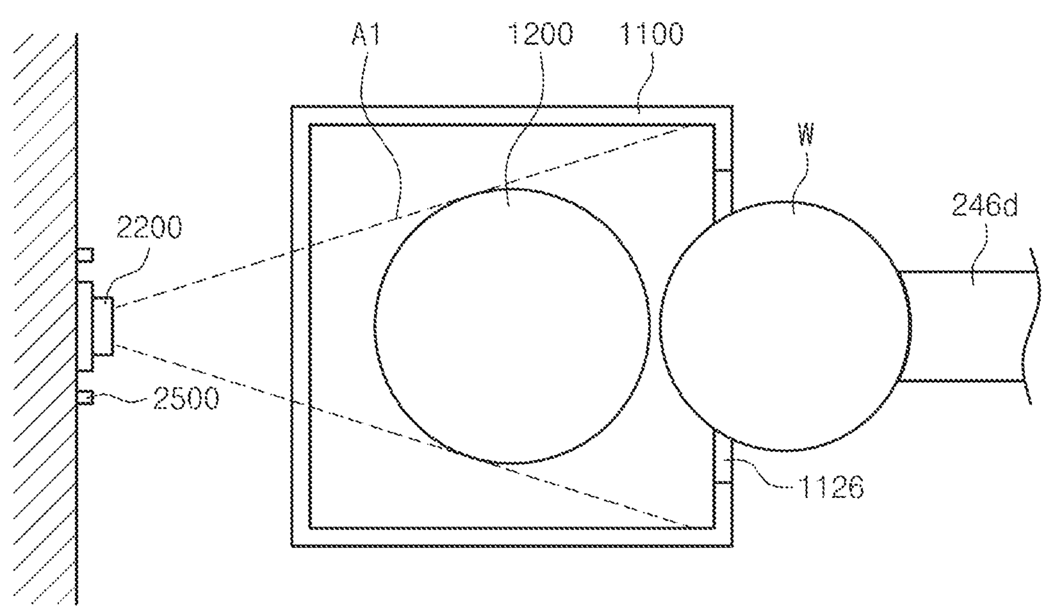
Figure 9:
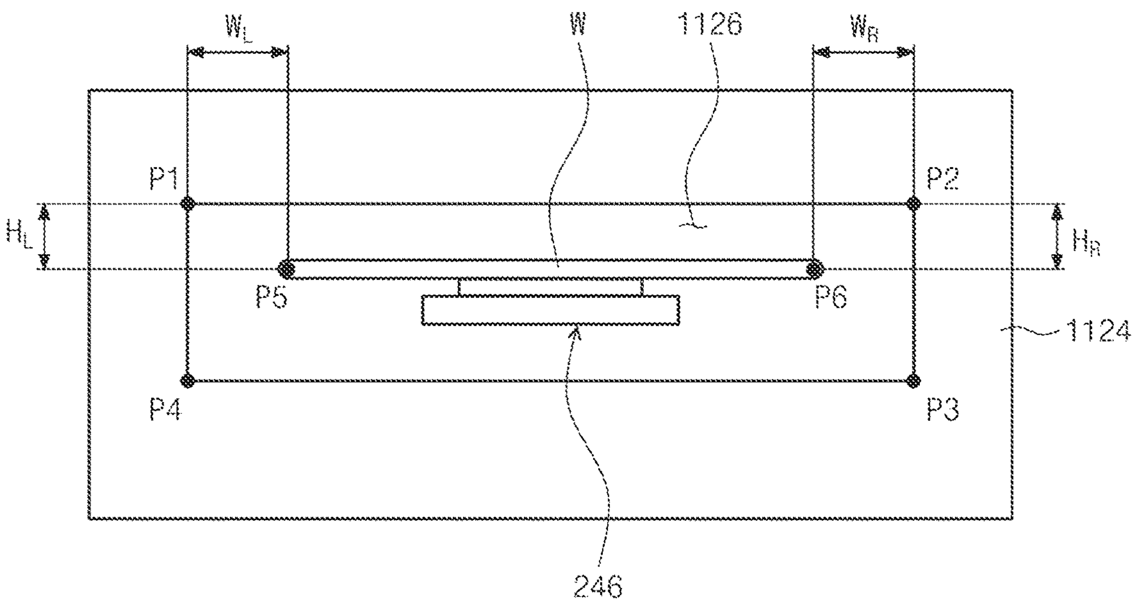
FIG. 9 and FIG. 10 illustrate an embodiment of an image data imaged by a first camera module according to an embodiment of the inventive concept.
Figure 10:
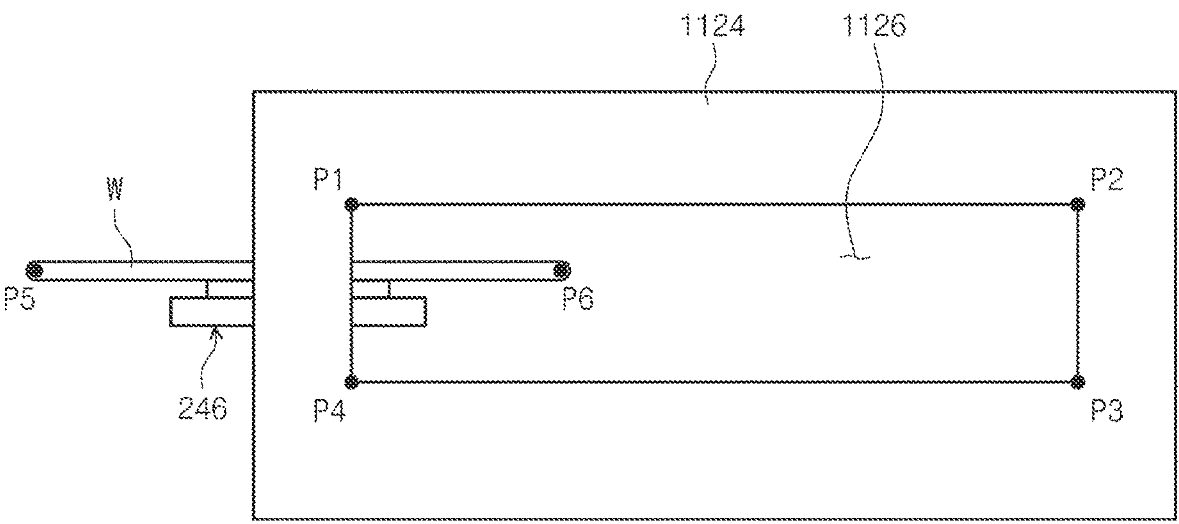
Figure 11:
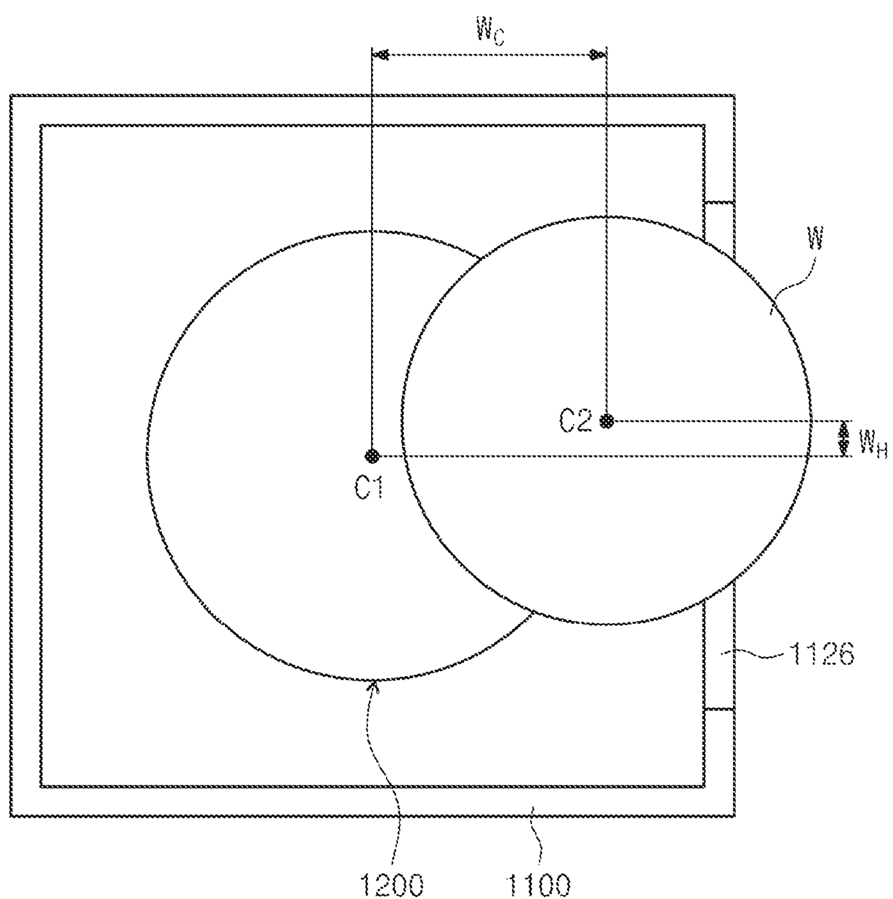
FIG. 11 illustrates an embodiment of an image data imaged by a second camera module according to an embodiment of the inventive concept.

FIG. 3 schematically illustrates a substrate treating apparatus of FIG. 2, a transfer robot, and an imaging unit. FIG. 4 schematically illustrates a controller for controlling the transfer robot of FIG. 3. FIG. 5 and FIG. 6 schematically illustrate a process in which a substrate passes through an entrance by the transfer robot. FIG. 7 and FIG. 8 are top plan views illustrating a process in which the substrate passes through the entrance by the transfer robot. FIG. 9 and FIG. 10 illustrate an embodiment of an image data imaged by a first camera module according to an embodiment of the inventive concept. FIG. 11 illustrates an embodiment of an image data imaged by a second camera module according to an embodiment of the inventive concept.

Referring to FIG. 3 and FIG. 4, the substrate treating apparatus 1000 includes an imaging unit 2000. The imaging unit 2000 may image the treating process by the substrate apparatus 1000. For example, the imaging unit 200 may image an inside of a chamber 1100. The imaging unit 1100 may image a treating space 1102 of the chamber 1100. The imaging unit 1100 may image the substrate W in the middle of being carried into the entrance 1126 by the transfer robot 246, starting from the substrate outside the substrate treating apparatus 1000.

The imaging unit 2000 is installed outside the chamber 1100. The imaging unit 2000 may include a plurality of camera modules. The imaging unit 1100 may include a first camera module 2200. The first camera module 2200 is installed at a position where the entrance 1126 may be imaged. The first camera module 2200 is provided at a position facing the entrance 1126. The first camera module 2200 is installed to face the entrance 1126. The first camera module 2200 is installed to face a sidewall 1124 positioned on an opposite side of a sidewall 1124 on which the entrance 1126 is installed. In this case, since the sidewall 1124 is provided with a transparent material, the first camera module 2200 may image an inside of the chamber 1100 through the sidewall 1124. The first camera module 2200 has a view angle A1 through which all of the entrance 1124 may be imaged.

The first camera module 2200 images the entrance 1126. The first camera module 2200 images a state in which the substrate W is being transferred through the entrance 1126 by the transfer robot 246. The first camera module 2200 images a state in which the substrate W is positioned in front of the entrance 1126 before the substrate W enters the entrance 1226. The first camera module 2200 images a process in which at least a part of the substrate W passes through the entrance 1126 and enters the treating space 1102 even before the substrate W enters the entrance 1126. FIG. 5 and FIG. 7 illustrate a state in which the substrate W is positioned at a first position, in front of the entrance 1126 while being supported by the transfer robot 246. FIG. 6 and FIG. 8 illustrate a state in which a part of the substrate W passes through the entrance 1126 and the substrate W is positioned at a second position. In this case, the second position means a position where at least a part of the substrate W passes through the entrance 1126, but all of the substrate W does not pass through the entrance 1126. Referring to FIG. 5 to FIG. 8, the first camera module 2200 images the substrate W at the first position of the substrate W. The first camera module 2200 may image a process in which the substrate W is being moved from the first position to the second position.

The first camera module 2200 generates a first image data with an image which has been imaged. The first image data may include a static image or a moving image. The first camera module 2200 transmits the generated the first image data to a first controller 2600 to be described later. The first camera module 2200 transmits the first image data to the first controller 2600 in real time. As shown in FIG. 5 and FIG. 7, the first camera module 2200 generates the first image data by imaging a state in which the substrate W is positioned at a first position. In addition, as shown in FIG. 5 to FIG. 8, the first camera module 2200 generates the first image data by imaging a process in which the substrate W is being moved from the first position to the second position.

FIG. 9 and FIG. 10 illustrate an embodiment of a first image data imaged by a first camera module 2200. Specifically, FIG. 9 and FIG. 10 may be the first image data obtained by imaging a state in which the substrate W is positioned at a first position. Referring to FIG. 9, the entrance 1126 includes a first apex to a fourth apex P1, P2, P3, and P4 adjacent to each other, and a substrate W includes a first end point P5 and a second end point P6. The first end point P5 is a point positioned close to a line segment connecting the first apex P1 and the fourth apex P4, and the second end point P6 is a point positioned close to a line segment connecting the second apex P2 and the third apex P3. In the first image data, a positional relationship between the entrance 1126 and a substrate W to enter the entrance 1126 appears.

The first controller 2600 receives the first image data from the first camera module 2200 and calculates a position of the transfer robot 246. The first controller 2600 will be described in detail later.

The second camera module 2400 is installed above the chamber 1100. The second camera module 2400 is installed at a position spaced apart from a top housing 1110 by a preset distance. The second camera module 2400 is installed at a position where the support unit 1200 may be imaged. The second camera module 2400 is installed at a position capable of simultaneously imaging the support unit 1200 and the entrance 1126. The second camera module 2400 is installed to face the support unit 1200. In this case, since the top housing 1110 is provided with a transparent material, the second camera module 2400 may image an inside of the chamber 1100 through the top housing 1110. The second camera module 2400 has a view angle A2 through which all of the support unit 1200 may be imaged. Selectively, the second camera module 2400 has an angle of view A2 at which all of the support unit 1200 and the entrance 1126 may be imaged.

The second camera module 2400 images the support unit 1200. The second camera module 2400 images the support unit 1200 and the entrance 1126. The second camera module 2400 images a process in which the substrate W entering the chamber 1100 through the entrance 1126 is transferred to a top part of the support unit 1200. The second camera module 2400 images a process in which the substrate W is moved to the top part of the support unit 1200 from a state positioned at the second position as illustrated in FIG. 6 and FIG. 8. The second camera module 2400 images a process of moving the substrate W to the top part of the support unit 1200 from a time the substrate W enters the entrance 1126.

The second camera module 2400 generates a second image data with an image which has been imaged. The second image data may include a static image or a moving image. The second camera module 2400 transmits a generated second image data to a first controller 2600 to be described later.

FIG. 11 illustrates an embodiment of a second image data imaged by a second camera module 2400. Referring to FIG. 11, the second image data may include a support unit 1200, a center point C1 of the support unit 1200, a substrate W, and a center point C2 of the substrate W.

The imaging unit 2000 may include an auxiliary member 2500. Each of the first camera module 2200 and the second camera module 2400 may include the auxiliary member 2500. One or a plurality of auxiliary members 2500 may be provided. The auxiliary member 2500 may include at least one of a distance measuring member, an illuminating member, a laser, and an interference pattern forming member. The auxiliary member 2500 serves to help main observation points of the first image data or the second image data to be clearly identified. For example, when the auxiliary member 2500 is provided as an illumination, a distinction of the subject becomes clear in an image data imaged by the imaging unit 2000. Accordingly, the controller may more easily identify the main observation points from the image data. For example, when the auxiliary member 2500 is provided as a laser, a position where the laser collides with walls of a chamber 1100 is expressed as a point in an image data obtained from the imaging unit 2000. In this case, the controller may more easily identify the main observation points from the image data.

In the above description, although the imaging unit 2000 includes two camera modules, the inventive concept is not limited thereto and may include three or more camera modules or one camera module. When the imaging unit 2000 includes one camera module, the camera module may be provided above a top housing 1110 or may be installed at a position spaced apart from an apex where the top housing 1110 of the chamber 1100 meets a sidewall 1124 positioned opposite the entrance 1126.

The substrate treating apparatus 1000 includes a controller. The controller may control all components of the substrate treating apparatus 1000. The controller may control a position of a transfer robot 246. The controller may receive the image data from the imaging unit 2000 and control the position of the transfer robot 246. The controller may control an overall operation of the substrate treating apparatus. The controller may include a central processing unit (CPU), a read only memory (ROM), and a random access memory (RAM). The CPU executes a desired treatment such as a liquid treatment, a drying treatment, a gas treatment, or a plasma treatment according to various recipes stored in these storage areas. A recipe may contain a process time, a process pressure, a process temperature, and various gas flow rates, which are a control information of the apparatus regarding process conditions. Meanwhile, these programs or recipes representing process conditions may be stored in a hard disk or a semiconductor memory. In addition, the recipe may be set at a predetermined location in the storage area while being stored in a storage medium such as a CD-ROM or DVD that is readable by a transportable computer.

The controller includes the first controller 2600 that receives the image data from the imaging unit 2000 and calculates a position data of the transfer robot 246. The first controller 2600 may be a teaching controller that adjusts the position of the transfer robot 246. The first controller 2600 receives the first image data from the first camera module 2200. The first controller 2600 calculates the first position data of the transfer robot 246 from the first image data. The first controller 2600 receives the first image data from the first camera module 2200 in real time and generates the first position data. The first controller 2600 identifies a first to a fourth apex P1, P2, P3, and P4 of the entrance 1126 and a first and a second end point P5 and P6 of the substrate W from the first image data. As shown in FIG. 9, the first controller 2600 generates the first position data of the transfer robot 246 such that the first and the second end points P5 and P6 of the substrate W are positioned within the first to fourth apexes P1, P2, P3, and P4 of the entrance 1126. Referring to FIG. 10, the first controller 2600 identifies from the first image data that the first and the second end points P5 and P6 of the substrate W are not positioned within the first to fourth apexes P1, P2, P3, and P4 of the entrance 1126. In this case, the first controller 2600 generates the first position data and sends it to the second controller 2800 so that the second controller 2800 moves the transfer robot 246 based on the first position such that the first and second end points P5 and P6 of the substrate W are positioned within the first to fourth apexes P1, P2, P3, and P4 of the entrance 1126 and transmits the same to the second controller 2800. The second controller 2800 moves the transfer robot 246 according to the first position data transmitted from the first controller 2600. Accordingly, it is possible to prevent the substrate W from colliding with a wall of the entrance 1126 or the chamber 1100 while the substrate is being transferred to a treating space 1102 of the chamber 1100.

The first controller 2600 may obtain a height information from the first image data. The first controller 2600 may obtain a first height information $H_L$ by calculating a distance between the first end point P5 and a line segment connecting the first apex P1 and the second apex P2. The first controller 2600 may obtain a second height information $H_R$ by calculating a distance between the second end point P6 and a line segment connecting the first apex P1 and the second apex P2. The first controller 2600 may check a horizontal state of the substrate W through the first height information $H_L$ and the second height information $H_R$, thereby generating the first position data. The second controller 2800 may horizontally level the substrate W by moving the transfer robot 246 based on the first position data. The first controller 2600 may check whether the first height information $H_L$ and the second height information $H_R$ are desired values. When the first height information $H_L$ and the second height information $H_R$ are different from the desired values, the first controller 2600 generates the first position data so that the first height information $H_L$ and the second height information $H_R$ reach the desired values. The second controller 2800 may control the transfer robot 246 to move its position according to the first position data so the substrate W may pass through the entrance 1126 while maintaining a desired value. The above-described desired values may be preset values so that the substrate W does not collide with the entrance 1126.

The first controller 2600 may obtain a width information from the first image data. The first controller 2600 may obtain a first width information $W_L$ by calculating a distance between the first end point P5 and a line segment connecting the first apex P1 and the fourth apex P4. The first controller 2600 may obtain a second width information WR by calculating a distance between the second end point P6 and a line segment connecting the second apex P2 and the third apex P3. The first controller 2600 may determine whether the first width information $W_L$ and the second width information $W_R$ are desired values. When the first width information $W_L$ and the second width information $W_R$ are different from the desired values, the first controller 2600 generates the first position data so that the first width information WL and the second width information $W_R$ become desired values. The second controller 2800 may control the transfer robot 245 to move its position according to the first position data so the substrate W may pass through the entrance 1126 while maintaining a desired value.

The first controller 2600 receives the second image data from the second camera module 2400. The first controller 2600 calculates the second position data of the transfer robot 246 from the second image data. The first controller 2600 receives the second image data from the second camera module 2400 in real time and generates the second position data of the transfer robot 246.

The first controller 2600 identifies a center point C1 of the support unit 1200 and a center point C2 of the substrate W from the second image data. The first controller 2400 generates the second position data of the transfer robot 246 so that the center point C1 of the support unit 1200 coincides with the center point C2 of the substrate W. Referring to FIG. 11, the first controller 2600 calculates a distance $W_C$ between the center point C1 of the support unit 1200 and the center point C2 of the substrate W in a transfer direction of the substrate, and a distance $W_H$ between the center point C1 of the support unit and the center point C2 of the substrate W in a direction perpendicular to the transfer direction of the substrate W. The first controller 2600 generates the second position data and send it to the second controller 2600 so that the second controller 2600 moves the transfer robot 246 based on the second position through the calculated distances $W_C$ and $W_H$. Accordingly, the substrate W may be seated in a correct position of the support unit 1200. In addition, as the position of the transfer robot 246 is automatically controlled through the controller, the substrate W may be constantly seated in the correct position of the support unit 1200, thereby increasing a process efficiency.

The controller includes the second controller 2800 that receives the position data of the transfer robot 246 from the first controller 2600 and controls the transfer robot 246. The second controller 2800 receives the position data from the first controller 2600 in real time. The second controller 2800 receives the first position data from the first controller 2600 and moves the transfer robot 246 according to the first position data. Thereafter, the second controller receives the second position data from the first controller 2600 and moves the transfer robot 246 according to the second position data.

The first controller 2600 may receive the second image data after receiving the first image data. The first controller 2600 may generate the second position data after generating the first position data. Accordingly, the second controller 2800 may control the position of the transfer robot 246 according to the first position data and then control the position of the transfer robot 246 according to the second position data. Accordingly, after firstly the position of the transfer robot 246 is controlled so that the substrate W enters the entrance 1126 without a collision, the center point C2 of the substrate W may be controlled to be positioned at a position coinciding with the center point C1 of the support unit 1200.

Hereinafter, a teaching method of a transfer robot according to an embodiment of the inventive concept will be described. A substrate W is placed on a transfer hand **246*d*. A transfer robot 246 transfers the substrate W to a treating space 1102 through an entrance 1126 of a chamber 1100 while supporting the substrate W on the transfer hand 246*d*. The teaching method of the transfer robot includes a first teaching step and a second teaching step. The first teaching step and the second teaching step are performed before the substrate W is introduced into the treating space 1102**. The second teaching step is performed after the first teaching step.

The first teaching step uses a first image data obtained by imaging the entrance 1126 of the chamber 1100. The first image data is acquired by the first camera module 2200. The first camera module 2200 acquires the first image data by imaging a state in which the substrate W supported on the transfer hand **246*d* is positioned in front of the entrance 1126. A first camera module 2200 acquires the first image data by imaging a process in which the substrate W supported by the transfer hand 246*d* outside the process chamber 1000 are passing through the entrance 1126. The first camera module 2200 transmits the first image data to the first controller 2600, and the first controller 2600 calculates a position to which the transfer hand 246*d* of the transfer robot 246** should be moved based on the first image data.

The first controller 2600 generates the first position data such that the first and second end points P5 and P6 of the substrate W are positioned within the first to fourth apexes P1, P2, P3, and P4 of the entrance 1126 through the first image data. The first controller 2600 identifies a height information $H_L$ and $H_R$ and a width information $W_L$ and $W_R$ between the endpoints P5 and P6 of the substrate W and the entrance 1126 and generates the second position data by comparing an identified height information $H_L$ and $H_R$ and a width information $W_L$ and $W_R$ with a desired value. The first controller 2200 transmits the first position data to the second controller 2800. The second controller 2800 controls the position of the transfer robot 246 or the transfer hand 246*d* according to the first position data. That is, in the first teaching step, a position for entering the entrance 1126 without colliding with sidewall of the chamber 1100 is taught. Accordingly, when the substrate W enters the chamber 1100 through the entrance 1126, it is possible to prevent the substrate W from colliding with the inner wall of the entrance 1126 or the walls of the chamber 1100. In addition, since the position of the transfer robot 246 is automatically corrected in real time through the first image data, the working time can be shortened and an operator's skill level does not have an affect.

The second teaching step uses the second image data obtained by imaging the support unit 1200 provided inside the chamber 1100. The second image data is acquired by the second camera module 2400. The second camera module 2400 acquires the second image data by imaging a process in which the substrate W supported by the transfer hand 246*d* is being transferred to the top part of the support unit 1200. The second camera module 2600 transmits the second image data to the first controller 2600, and the first controller 2600 calculates a position to which the transfer hand 246*d* of the transfer robot 246 should be moved based on the second image data. Referring to FIG. 11, the first controller 2600 calculates a distance We between a center point C1 of the support unit 1200 and a center point C2 of the substrate W in a transfer direction of the substrate, and a distance $W_H$ between the center point C1 of the support unit and the center point of the substrate W in a direction perpendicular to the transfer direction of the substrate W. The first controller 2600 generates the second position data to which the transfer robot 246 or the transfer hand 246*d* should be moved based on calculated distances $W_C$ and $W_H$, and transmits the data to the second controller 2800. The second controller 2800 controls the position of the transfer robot 246 or the transfer hand 246*d* according to the second position data. That is, in the second teaching step, the position of the transfer hand 246*d* is taught such that the substrate W is positioned at a correct position (a position where center points of each other coincide). Accordingly, since the position of the transfer robot 246 is automatically corrected in real time through the second image data, a working time may be shortened. In addition, since the position where the substrate W is seated on the support unit 1200 is constant, an operator's skill level does not have an affect.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus comprising:

a chamber having an entrance for taking in and taking out a substrate at a side wall and having an opposite sidewall including a transparent material;

a support chuck provided inside of the chamber and supporting the substrate;

a first camera module for imaging the substrate configured to be taken in by a transfer robot through the entrance, wherein the first camera module is installed outside of the chamber and positioned to face the opposite sidewall of the chamber and is configured for imaging the entrance of the chamber through the transparent material of the opposite sidewall; and a controller configured to control a position of the transfer robot based on image data from the first camera module, wherein the controller comprises:

a first controller calculating a position data of the transfer robot; and a second controller controlling the transfer robot based on the position data of the transfer robot from the first controller, wherein the first camera module generates a first image data by imaging the substrate which is being passed through the entrance from outside the entrance, and the first controller receives the first image data in real time from the first camera module to generate a first position data of the transfer robot so the substrate passes through the entrance, wherein the entrance includes a first apex to a fourth apex adjacent to each other defining a passage for the substrate, the substrate includes a first end point, and a second end point positioned opposite to the first end point, the first controller identifies the first apex to the fourth apex of the entrance and the first end point and the second end point of the substrate from the first image data, the first controller generates the first position data of the transfer robot so the first end point and the second end point of the substrate are positioned within the passage defined by the first apex to the fourth apex of the entrance, and the second controller controls the position of the transfer robot by receiving the first position data from the first controller in real time.

2. The substrate treating apparatus of claim 1, further comprising a second camera module installed above the chamber for imaging the support chuck.

3. The substrate treating apparatus of claim 2, wherein the second camera module generates a second image data by imaging the substrate which is being transferred onto a top part of the support chuck inside the chamber, and the first controller generates a second position data of the transfer robot by receiving the second image data from the second camera module in real time.

4. The substrate treating apparatus of claim 3, wherein the first controller identifies a center point of the support chuck and a center point of the substrate based on the second image data, the first controller calculates the second position data of the transfer robot so the center point of the support chuck and the center point of the substrate are matched, and the second controller controls the transfer robot by receiving the position data of the transfer robot from the first controller.

5. The substrate treating apparatus of claim 4, wherein the second position data is calculated based on:

a first distance between the center point of the support chuck and the center point of the substrate in a first direction, wherein the first direction is a transfer direction of the substrate, and a second distance between the center point of the support chuck and the center point of the substrate in a second direction, wherein the second direction is a direction perpendicular to the transfer direction of the substrate.

6. The substrate treating apparatus of claim 2, wherein the first camera module and the second camera module are configured for at least one of the following:

illumination, or providing a laser.

7. The substrate treating apparatus of claim 2, wherein the second camera module is configured for simultaneously imaging the entrance of the chamber and the support chuck.

8. The substrate treating apparatus of claim 1, wherein the first controller calculates a first height information between the first end point and a line segment connecting the first apex and the second apex and a second height information between the second end point and the line segment, and the first controller generates the first position data by determining whether the first height information and the second height information correspond to a target value.

9. The substrate treating apparatus of claim 1, wherein the first controller calculates a first width information between the first end point and a line segment connecting the first apex to the fourth apex and a second width information between the second end point and a line segment connecting the second apex and the third apex, and the first controller generates the first position data by determining whether the first width information and the second width information correspond to a target value.

10. The substrate treating apparatus of claim 1, wherein the chamber is made from a conductive material.

11. The substrate treating apparatus of claim 1, wherein the chamber includes an exhaust hole disposed through a bottom wall.

12. The substrate treating apparatus of claim 1, wherein the support chuck adsorbs the substrate using electrostatic force.

* * * * *